United States Patent [19]

Zukotynski

[11] Patent Number: 4,508,932
[45] Date of Patent: Apr. 2, 1985

[54] SILICON-BASED SOLAR ENERGY CONVERSION CELLS

[75] Inventor: Stefan Zukotynski, Thornhill, Canada

[73] Assignee: The Innovations Foundation of the University of Toronto, Toronto, Canada

[21] Appl. No.: 623,056

[22] Filed: Jun. 21, 1984

Related U.S. Application Data

[63] Continuation-in-part of Ser. No. 369,384, Apr. 19, 1982, abandoned.

[51] Int. Cl.³ .............................................. H01L 31/06
[52] U.S. Cl. ...................................... 136/258; 427/13; 427/74; 427/248.1; 427/295
[58] Field of Search ............... 427/13, 74, 248.1, 295; 204/192 N; 136/258 AM; 357/2, 30; 148/174

[56] References Cited

U.S. PATENT DOCUMENTS 4,342,631  8/1982  White et al. ................... 204/192 N
4,416,912  11/1983  Bache ........................ 427/248.1 X

FOREIGN PATENT DOCUMENTS 31-731  7/1981  European Pat. Off. .... 136/258 AM

Primary Examiner—Evan K. Lawrence
Attorney, Agent, or Firm—Hirons, Rogers & Scott

[57] ABSTRACT

Silicon-based solar cells devised hitherto have used crystalline silicon because of its acceptable electrical characteristics. Amorphous silicon is much cheaper and has better optical absorption characteristics, but its electrical characteristics are so poor that it cannot be used, without some additional treatment such as hydrogenation. The invention provides a method of production of solar cells using amorphous silicon in which the silicon is evaporated in a suitable vacuum onto a substrate in the presence of a positive field which opposes the migration of the positive silicon ions toward the substrate. The resulting devices are found to have much improved electrical characteristics while retaining a good absorption characteristic. A tentative hypothesis is given for the unexpected improvement.

20 Claims, 3 Drawing Figures

SILICON-BASED SOLAR ENERGY CONVERSION CELLS

CROSS-REFERENCE TO RELATED APPLICATIONS

This application is a Continuation-In-Part to my earlier application Ser. No. 06/369,384, filed 4/19/82, now abandoned.

FIELD OF THE INVENTION

The present invention is concerned with improvements in or relating to methods of manufacture of silicon-based solar energy conversion cells and to cells produced by the methods.

REVIEW OF THE PRIOR ART

The field of solar energy conversion cells continues to be of considerable interest, since there are numerous applications in which they are already a practicable source of electric power, and number may be expected to increase as the efficiency of cells is increased, the cost of production is decreased, and the cost of alternative energy sources increases. It is well known to use silicon as the basic converter material in such cells, and in a known construction a wafer of appropriately-doped crystalline silicon has electrical contacts applied, the cell being completed by the application of an anti-reflection coating and any transparent protective layer that may be required.

The silicon can be produced either in the amorphous or the crystalline form, the former having superior optical absorption properties over the latter, especially in the range of wavelengths found in solar radiation, while the crystalline form has superior electrical properties. Thus, as compared to the crystalline form amorphous silicon is found to have a large density of states in the energy gap, to the extent that it is difficult to dope and it has an extremely low excess carrier life time; consequently untreated amorphous silicon has been impractical for solar cell use, and proposals have therefore been made to alleviate this disadvantage, for example by introducing hydrogen into the silicon, which significantly reduces the states density, but also results in reduced optical absorption. Despite this reduction the optical absorption of the hydrogenated form is sufficiently superior to the untreated amorphous form to justify its commercial use, as a result of which thin and cheap silicon films can be employed; the crystalline form must be quite thick and such thick crystalline wafers are relatively expensive. Even though the maximum electrical reported efficiency of an amorphous device is only 10%, as compared to 18% obtainable with a crystalline device, the end cost of the amorphous device is about one tenth that of the crystalline device.

DEFINITION OF THE INVENTION

It is the principal object of the invention to provide a new method of making silicon-based solar energy conversion devices and the devices produced by the method.

In accordance with the present invention there is provided a method of making an amorphous silicon-based solar energy conversion device comprising:

placing a substrate to be coated and a source of silicon vapour in the enclosure and establishing a vacuum of at least $1 \times 10^{-4}$ Torr in the enclosure, heating the silicon source in the said vacuum to a temperature such as to cause the production of heated silicon vapour within the enclosure, whereby the substrate is exposed in the enclosure under said vacuum to the heated silicon vapour for deposit thereon of a layer of amorphous silicon, applying an electric field between the source and the substrate with the substrate positive with respect to the source, so that the electric field opposes the deposition of positive silicon ions on the substrate to result in a layer of amorphous silicon having improved electrical characteristics as compared to a layer deposited in the absence of an electric field.

Preferably the electric field has a value from about 10 to about 33 volts per cm, and preferably the potential difference has a value of from about 200 to about 500 volts, applied over a distance of about 15 cm to about 20 cm. The substrate may be heated to a temperature not higher than about 350° C., and preferably is heated to a temperature of about 200° C.

DESCRIPTION OF THE DRAWINGS

Methods of the invention, products of the method and apparatus for carrying out the methods will now be described, by way of example, with reference to the accompanying drawings, wherein.

DESCRIPTION OF THE PREFERRED EMBODIMENTS

Figure 1:
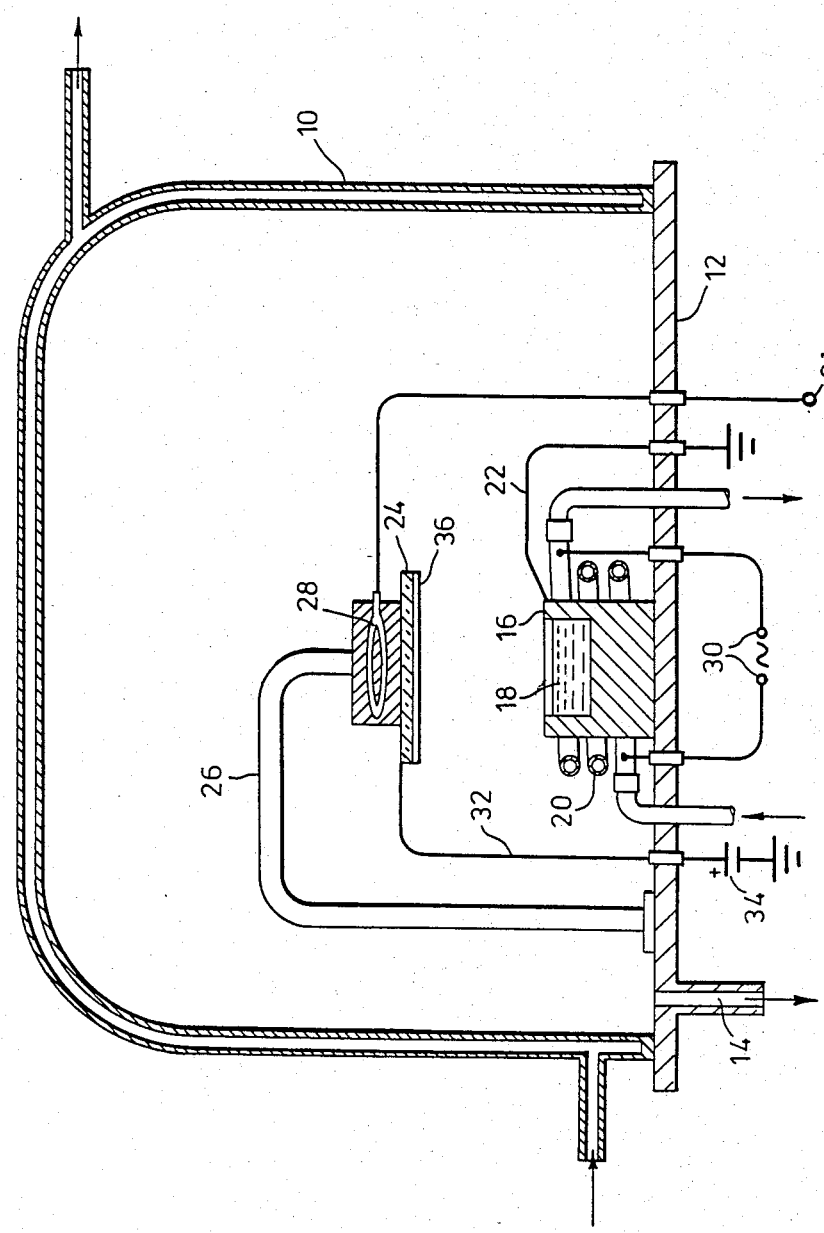
FIG. 1 is a schematic diagram of an apparatus for carrying out the methods of the invention.

A water cooled stainless steel bell jar cover 10 is mounted on a base 12 and a vacuum is produced in its interior via an outlet 14. A carbon crucible 16 mounted on the base contains a charge of silicon 18 that is heated by heating the crucible via a surrounding water-cooled induction heating coil heater 20 to a temperature at which it will evaporate freely, usually about 1400° C. The crucible is electrically grounded via a lead 22. A substrate member 24, for example a thin layer of stainless steel supported on a suitable backing member electrically insulated from ground, is mounted by arm 26 above the crucible and can be heated by a heater 28 to an elevated temperature not greater than about 350° C., and usually about 200° C. The heaters are supplied with power from respective terminals 30 and 31. The substrate is electrically connected by a lead 32 to the positive terminal of a battery 34 by which the substrate is positively charged relative to the crucible, so that a corresponding positive field is established between them and opposes the transfer of the evaporated positive silicon ions to the substrate. Nevertheless, silicon is deposited on the substrate in the form of a thin layer 36 thereof, and surprisingly is found to have better electrical characteristics than the amorphous silicon that would be deposited in the absence of the electric field, while retaining the excellent absorption characteristics of amorphous silicon.

The silicon 18 employed is a high purity polycrystalline grade (impurities of a few ppb) supplied by Monsanto for the production of silicon wafers. Silicon of such high purity was employed to avoid the possibility of test results being invalidated by some particular impurity. The substrate is of pre-prepared glass, such as Corning 7059* Glass intended for as a substrate in evaporation techniques, or thin 304 stainless steel that has been polished and cleaned. After placement of the crucible and the substrate the interior of the bell jar is pumped with the substrate heated to about 200° C. until a vacuum of at least $1 \times 10^{-8}$ Torr has been achieved, conveniently by pumping overnight. Air alone can be removed by pumping for about 3–4 hours, but difficulty is obtained in removing sufficient of the water vapour that inherently is present and a longer pumping time is preferred for this reason. Removal of the water vapour is facilitated by cooling the metal bell jar, when the residual polar water vapour molecules preferably condense on its interior surface. It is believed that at the temperature of the process the water vapour may react with the carbon of the crucible to produce carbon dioxide, carbon monoxide and hydrogen; the carbon oxides and hydrogen are easily removed, but minor amounts of carbon, oxygen and hydrogen consistent with this hypothesis are found in the resultant films.

*Trademark

This relatively high degree of vacuum is not essential and a value of $1 \times 10^{-6}$ Torr would be satisfactory for commercial and more usual application. Values as low as $1 \times 10^{-4}$ might also be tolerated provided that other conditions are not such that a glow discharge is obtained. It is found in practice that there must be a sufficient distance between the boiling silicon and the substrate such that silicon other than in pure vapour form (e.g. splashes and globules) cannot be deposited on the substrate; a distance of 15 cm is usually sufficient for this purpose but can of course be reduced if other precautions are taken against this effect.

In a specific embodiment therefore the distance between the substrate and the silicon is about 15 to 20 cm, and over this distance a potential of 200 to 500 volts is found to be effective, which corresponds to a field of from about 10 to 33 volts per cm. Voltages of up to 1000 over a distance of 20 cm (50 volts per cm) have also been employed, but do not appear to be any more effective than the lower values. The silicon layer 36 can be quite thin and thicknesses thereof from about 0.2 to 1.5 micrometers are suitable. A thickness value of about 0.5 micrometer is particularly preferred and requires about 3 hours of operation for its deposition. Films of up to 3 micrometers have been produced for study of their absorption characteristics, but are not found to justify the additional costs, etc. involved in their production.

Devices in accordance with the invention have been examined by Dr. B. G. Yacobi of the Solar Energy Research Institute of Golden, Colo., U.S.A. by electron diffraction using an electron microscope. He has reported informally that at the level of 20–30 Angstroms no microcrystallinity was observed, and it must be concluded therefore that the silicon is in amorphous state, but with structural order at the atomic level that has been enhanced by the application of the invention, as will be apparent from the following review of observed data.

Figure 2:
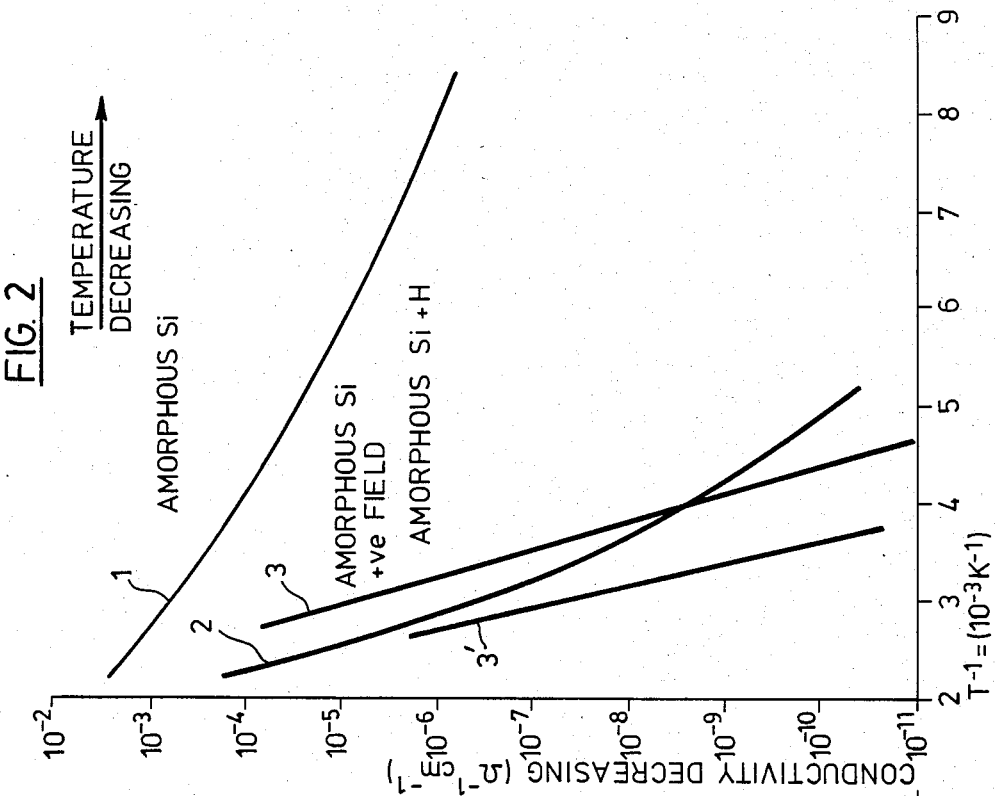
FIG. 2 is a graph of the change of conductivity with change in temperature for amorphous and hydrogenated amorphous silicon materials, and silicon materials of the invention, to show the comparison of this electrical characteristic between hydrogenated amorphous silicon and silicon of the invention.

Thus, FIG. 2 is a graph of the conductivity of the resultant films ($\sigma$) against the reciprocal of the respective temperature. Line 1 is for an evaporated amorphous first device produced without the application of an electric field, while line 2 is for a second device produced with a field of 500 volts at a distance of 20 cm (25 volts per cm). The marked increase in slope from line 1 to line 2 may be noted. The lower slope for the zero field first amorphous device shows that there is a large density of states in the energy gap, and it is the presence of these states that reduces the capacity for decrease in conductivity as the temperature decreases. It is therefore significant to compare this parameter of the second device with that of a third device in which the silicon layer has been hydrogenated; the characteristics of two such hydrogenated devices are shown as lines 3 and 3' and it will be seen that they correspond closely to that of a device of the invention, so that the employment of the invention produces an equivalent effect to hydrogenation.

Figure 3:
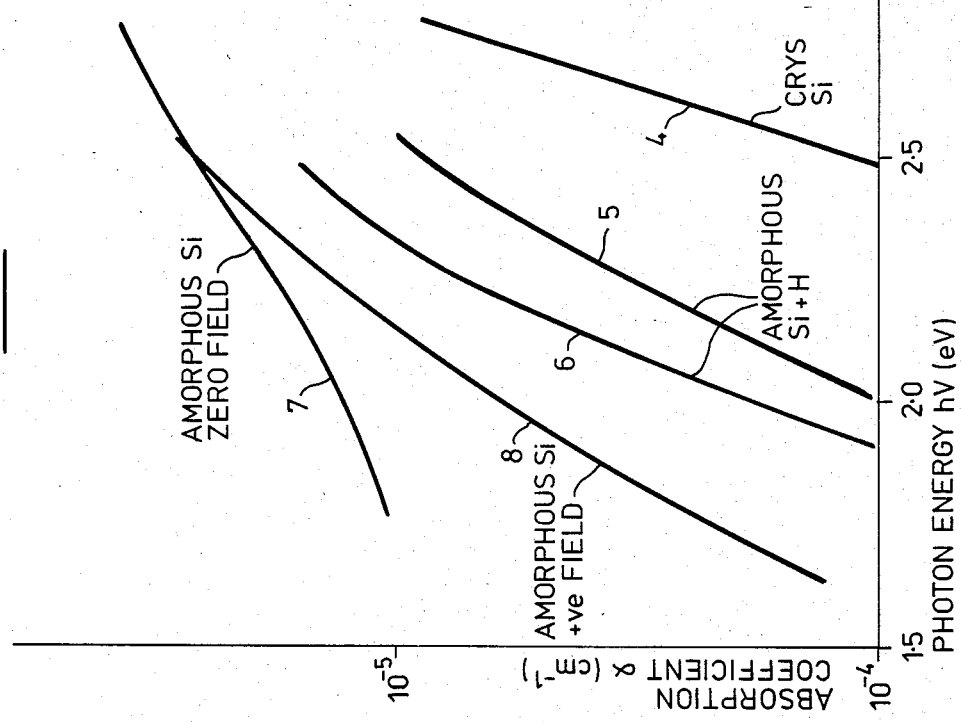
FIG. 3 is a graph of the change of absorption coefficient with change of photon energy of the different silicon materials to show the improvement obtained with the materials of the invention as compared with crystalline and hydrogenated amorphous materials.

FIG. 3 is a graph of the optical absorption coefficient ($\alpha$) of different devices plotted against the photon energy of the incident radiation in electron-volts. Line 4 shows the characteristic for a typical crystalline silicon and it will be noted that this intersects the ordinate at about 2.5 electron volts, which is about green on the colour scale. A lower value of absorption means of course that a thicker layer of the relatively expensive crystalline silicon is required for energy capture and conversion. Lines 5 and 6 are the characteristics for hydrogenated amorphous silicon devices and the considerable shift toward the shorter red end of the spectrum will be noted, signifying that there is correspondingly greater capture of higher energy photons. Line 7 is for an amorphous device produced with zero field and the much greater absorption than the crystalline or hydrogenated amorphous devices is to be noted. Line 8 is for a device of the invention with which the vaporised silicon again was subjected to a field of 500 volts at 20 cm; it will be noted that the absorption mostly is somewhat less than that of the zero field device. Despite the lower absorption obtained for photons of less than 2.5 electron volts the values are about 3 to 5 times greater than for the hydrogenated silicon, and the electrical characteristic of the untreated amorphous material make it unsuited for solar cells.

At this time I have no provable reason for this improvement in electrical characteristics of the vaporised silicon, and I do not intend to be bound by the following hypothesis, which is given solely as a possible explanation of this unexpected effect. Under zero field evaporation conditions positively charged silicon ions form part of the stream of silicon reaching the substrate surface. They are not particularly mobile when they reach the substrate surface and tend to "stick" where they land, so that a completely random amorphous structure results, even though the majority of silicon reaching the surface is in the form of mobile neutral atoms and negative ions. The positive field tends to reject the positive silicon ions while causing an accumulation of electrons at the surface. Neutral silicon atoms and negative ions that have a large surface mobility still reach the surface, any positive silicon ions "eager" for bonding which do reach the surface immediately bond with the available electrons and are electronically "neutral" silicon atoms on landing, so that they become much more mobile and are also able to migrate on the surface to bond with other neutral silicon atoms to form a more ordered structure than is normally obtained with evaporated amorphous material, having much of the superior electrical property of macro-crystalline silicon, while yet exhibiting superior absorption characteristics close to those of the amorphous form. It is believed significant for this hypothesis that heating of the substrate is found to improve the effect, since again increased mobility results from the increased temperature. The substrate temperature cannot be raised too far or the crystallisation will also proceed too far and the absorption coefficient adversely affected. The preferred maximum value for the substrate is therefore only 350° C., more preferably 200° C., even though the usual temperature for the production of the crystalline form is over 500° C.

I claim:

1. A method of making an amorphous silicon-based solar energy conversion device comprising:

placing a substrate to be coated and a source of silicon vapour in an enclosure and establishing a vacuum of a least $1 \times 10^{-4}$ Torr in the enclosure, heating the silicon source in the said vacuum to a temperature such as to cause the production of heated silicon vapour within the enclosure, whereby the substrate is exposed in the enclosure under said vacuum to the heated silicon vapour for deposit thereon of a layer of amorphous silicon, applying an electric field between the source and the substrate with the substrate positive with respect to the source, so that the electric field opposes the deposition of positive silicon ions on the substrate to result in a layer of amorphous silicon having improved electrical characteristics as compared to a layer desposited in the absence of an electric field.

2. A method as claimed in claim 1, wherein the said vacuum is at least $1 \times 10^{-6}$ Torr 3. A method as claimed in claim 1, wherein the electric field has a value of from about 10 to about 33 volts per cm.

4. A method as claimed in claim 2, wherein the electric field has a value of from about 10 to about 33 volts per cm.

5. A method as claimed in claim 1, wherein the potential difference of the field has a value of from about 200 to about 500 volts, applied over a distance of about 15 cm to about 20 cm.

6. A method as claimed in claim 2, wherein the potential difference of the field has a value of from about 200 to about 500 volts, applied over a distance of about 15 cm to about 20 cm.

7. A method as claimed in claim 1, wherein the substrate is heated to a temperature not higher than about 350° C.

8. A method as claimed in claim 2, wherein the substrate is heated to a temperature not higher than about 350° C.

9. A method as claimed in claim 1, wherein the substrate is heated to a temperature of about 200° C.

10. A method as claimed in claim 2, wherein the substrate is heated to a temperature of about 200° C.

11. A silicon-based solar energy conversion device when prepared by the method of claim 1.

12. A silicon-based solar energy conversion device when prepared by the method of claim 2.

13. A silicon-based solar energy conversion device when prepared by the method of claim 3.

14. A silicon-based solar energy conversion device when prepared by the method of claim 4.

15. A silicon-based solar energy conversion device when prepared by the method of claim 5.

16. A silicon-based solar energy conversion device when prepared by the method of claim 6.

17. A silicon-based solar energy conversion device when prepared by the method of claim 7.

18. A silicon-based solar energy conversion device when prepared by the method of claim 8.

19. A silicon-based solar energy conversion device when prepared by the method of claim 9.

20. A silicon-based solar energy conversion device when prepared by the method of claim 10.

* * * * *